(12) United States Patent
Wallace et al.

(10) Patent No.: US 7,214,274 B2
(45) Date of Patent: May 8, 2007

(54) METHOD AND APPARATUS FOR THERMALLY INSULATING ADJACENT TEMPERATURE CONTROLLED PROCESSING CHAMBERS

(75) Inventors: Jay Wallace, Danvers, MA (US); Thomas Hamelin, Georgetown, MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/705,397

(22) Filed: Nov. 12, 2003

(65) Prior Publication Data

US 2004/0182324 A1    Sep. 23, 2004

Related U.S. Application Data

(60) Provisional application No. 60/454,644, filed on Mar. 17, 2003.

(51) Int. Cl.
C23C 16/00 (2006.01)
C23F 1/00 (2006.01)
H01L 21/306 (2006.01)

(52) U.S. Cl. .................. 118/719; 118/733; 156/345.31; 156/345.32; 414/935; 414/939; 34/209; 34/242; 432/242; 204/298.23; 204/298.35

(58) Field of Classification Search ........... 156/345.31, 156/345.32; 118/719; 414/935, 939
See application file for complete search history.

(56) References Cited

U.S. PATENT DOCUMENTS

| | | | |
|---|---|---|---|
| 5,223,113 A | * | 6/1993 | Kaneko et al. ........ 204/298.33 |
| 5,282,925 A | | 2/1994 | Jeng et al. |
| 5,294,572 A | * | 3/1994 | Granneman et al. ........ 438/694 |
| 5,838,055 A | | 11/1998 | Kleinhenz et al. |
| 5,876,879 A | | 3/1999 | Kleinhenz et al. |
| 6,071,815 A | | 6/2000 | Kleinhenz et al. |
| 6,074,951 A | | 6/2000 | Kleinhenz et al. |
| 6,198,074 B1 | | 3/2001 | Savas |

(Continued)

FOREIGN PATENT DOCUMENTS

EP    0 818 807 A2    1/1998

(Continued)

OTHER PUBLICATIONS

U.S. Appl. No. 10/705,200, filed Nov. 12, 2003, Hamelin.

(Continued)

*Primary Examiner*—Karla Moore
(74) *Attorney, Agent, or Firm*—Pillsbury Winthrop Shaw Pittman LLP

(57) ABSTRACT

A dual chamber apparatus including a first chamber and a second chamber which is configured to be coupled to the first chamber at an interface. Each of the first chamber and the second chamber has a transfer opening located at the interface. An insulating plate is located on one of the first chamber and the second chamber at the interface and is configured to have a low thermal conductivity such that the first chamber and the second chamber can be independently controlled at different temperatures when the first chamber and the second chamber are coupled together. Additionally, the apparatus may include an alignment device and/or a fastening device for fastening the first chamber to the second chamber. In embodiments, the insulating plate may be constructed of Teflon. Further, the first chamber may be a chemical oxide removal treatment chamber and the second chamber may be a heat treatment chamber.

12 Claims, 8 Drawing Sheets

U.S. PATENT DOCUMENTS

| | | |
|---|---|---|
| 6,245,619 B1 | 6/2001 | Boyd et al. |
| 6,271,094 B1 | 8/2001 | Boyd et al. |
| 6,335,261 B1 | 1/2002 | Natzle et al. |
| 6,469,780 B1 * | 10/2002 | McDermott et al. .......... 356/37 |
| 6,814,813 B2 * | 11/2004 | Dando et al. ............... 118/719 |
| 2001/0016226 A1 | 8/2001 | Natzle et al. |
| 2002/0028555 A1 | 3/2002 | Boyd et al. |
| 2002/0063110 A1 | 5/2002 | Cantell et al. |
| 2002/0195201 A1 * | 12/2002 | Beer et al. ............. 156/345.31 |
| 2003/0159780 A1 * | 8/2003 | Carpenter et al. ..... 156/345.31 |

FOREIGN PATENT DOCUMENTS

| | | |
|---|---|---|
| JP | 2000-021799 | 1/2000 |

OTHER PUBLICATIONS

U.S. Appl. No. 10/705,201, filed Nov. 12, 2003, Hamelin.
U.S. Appl. No. 10/704,969, filed Nov. 12, 2003, Hamelin.

* cited by examiner

US 7,214,274 B2

METHOD AND APPARATUS FOR THERMALLY INSULATING ADJACENT TEMPERATURE CONTROLLED PROCESSING CHAMBERS

This non-provisional application claims the benefit of U.S. Provisional Application No. 60/454,644, which was filed on Mar. 17, 2003, the content of which is hereby incorporated in its entirety.

CROSS-REFERENCE TO RELATED APPLICATIONS

This application is related to U.S. patent application Ser. No. 10/705,200, filed on Nov. 12, 2003, now U.S. Pat. No. 6,951,821; U.S. patent application Ser. No. 10/704,969, filed on Nov. 12, 2003, now U.S. Pat. No. 7,079,760; and U.S. patent application Ser. No. 10/705,201, filed on Nov. 12, 2003, now U.S. Pat. No. 7,029,536. The entire contents of all of those applications are herein incorporated by reference in their entireties.

BACKGROUND OF THE INVENTION

1. Field of the Invention

The present invention relates to a method and apparatus for thermally insulating adjacent temperature controlled processing chambers.

2. Description of Related Art

Processing chambers, such as those used in semiconductor manufacturing, often need to be maintained at a particular temperature to be operative. Examples of temperature sensitive processes include chemical oxide removal (COR) treatment and substrate heat treatment.

COR treatment can be used to process a mask in an oxide layer of a semiconductor device which can be used to etch a substrate with feature dimensions around 100 nanometers or less. COR treatment may include exposing surfaces of the oxide layer to process gases and heat treating the chemically treated oxide of the semiconductor device.

It may be desirable to perform each of these processes (i.e., chemical treatment and heat treatment) at different temperatures. Accordingly, these processes may be performed in different chambers. Additionally, exposure of the semiconductor device outside of the chambers may not be desirable between the processing phases.

SUMMARY OF THE INVENTION

The present invention provides a novel method and apparatus for thermally insulating adjacent temperature controlled processing chambers, or adjacent processing chambers of different temperature.

A dual chamber apparatus is provided with a first chamber and a second chamber which is configured to be coupled to the first chamber at an interface. Each of the first chamber and the second chamber has a transfer opening located at the interface. An insulating plate is located on one of the first chamber and the second chamber at the interface and is configured to have a low thermal conductivity such that the first chamber and the second chamber can be independently controlled at different temperatures when the first chamber and the second chamber are coupled together. Additionally, the apparatus may include an alignment device and/or a fastening device for fastening the first chamber to the second chamber. In embodiments, the insulating plate may be constructed of Teflon. Further, the first chamber may be a chemical oxide removal treatment chamber and the second chamber may be a heat treatment chamber.

BRIEF DESCRIPTION OF THE DRAWINGS

The accompanying drawings, which are incorporated in and constitute a part of the specification, of embodiments of the invention, together with the general description given above and the detailed description of the embodiments given below, serve to explain the principles of the invention wherein.

DETAILED DESCRIPTION OF A PREFERRED EMBODIMENT OF THE INVENTION

The present invention will be described below with reference to the illustrative embodiments disclosed.

Figure 1:
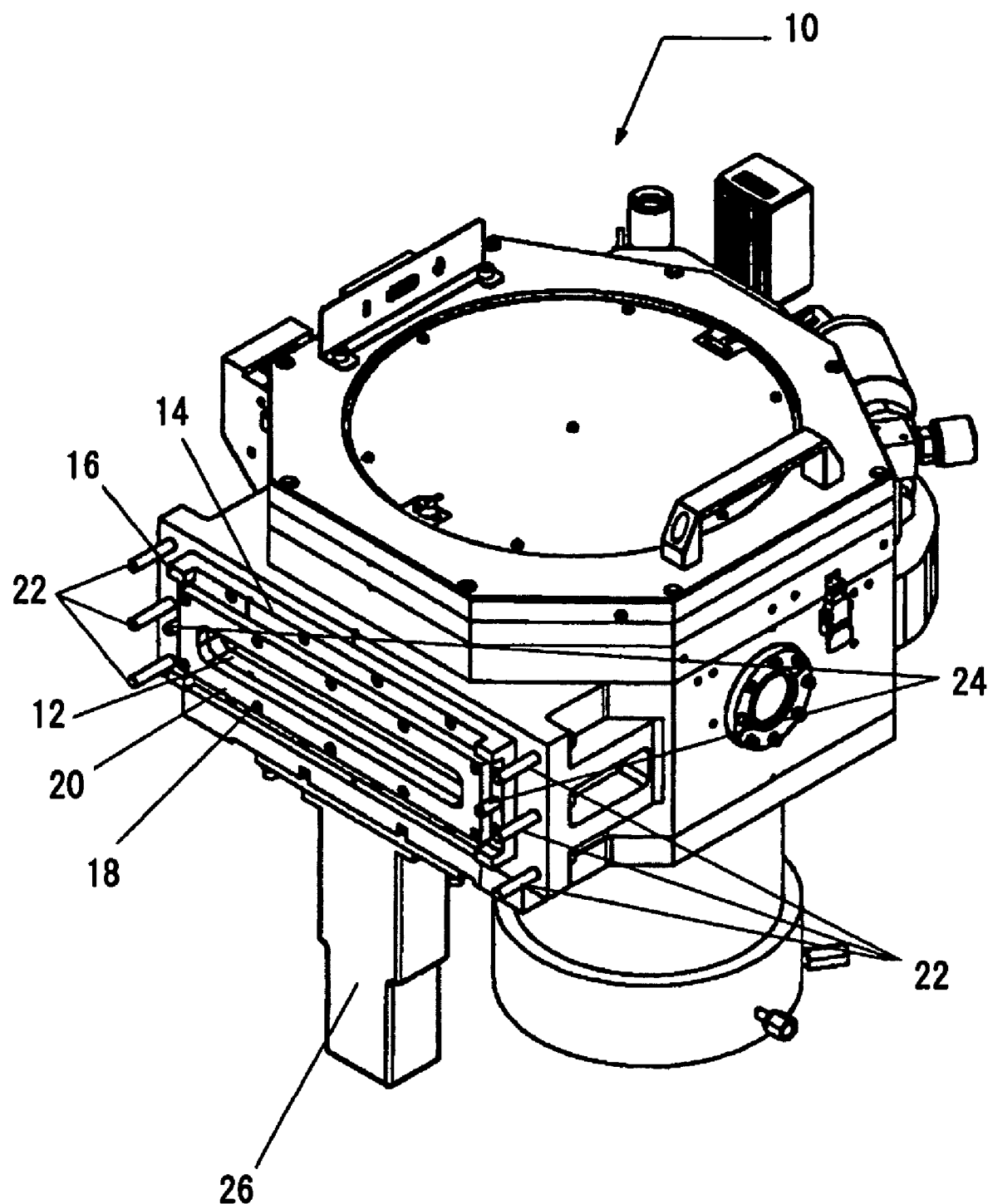
FIG. 1 is a perspective view of a first processing chamber which can be thermally insulated from a second processing chamber in accordance with an embodiment of the present invention.
Figure 2:
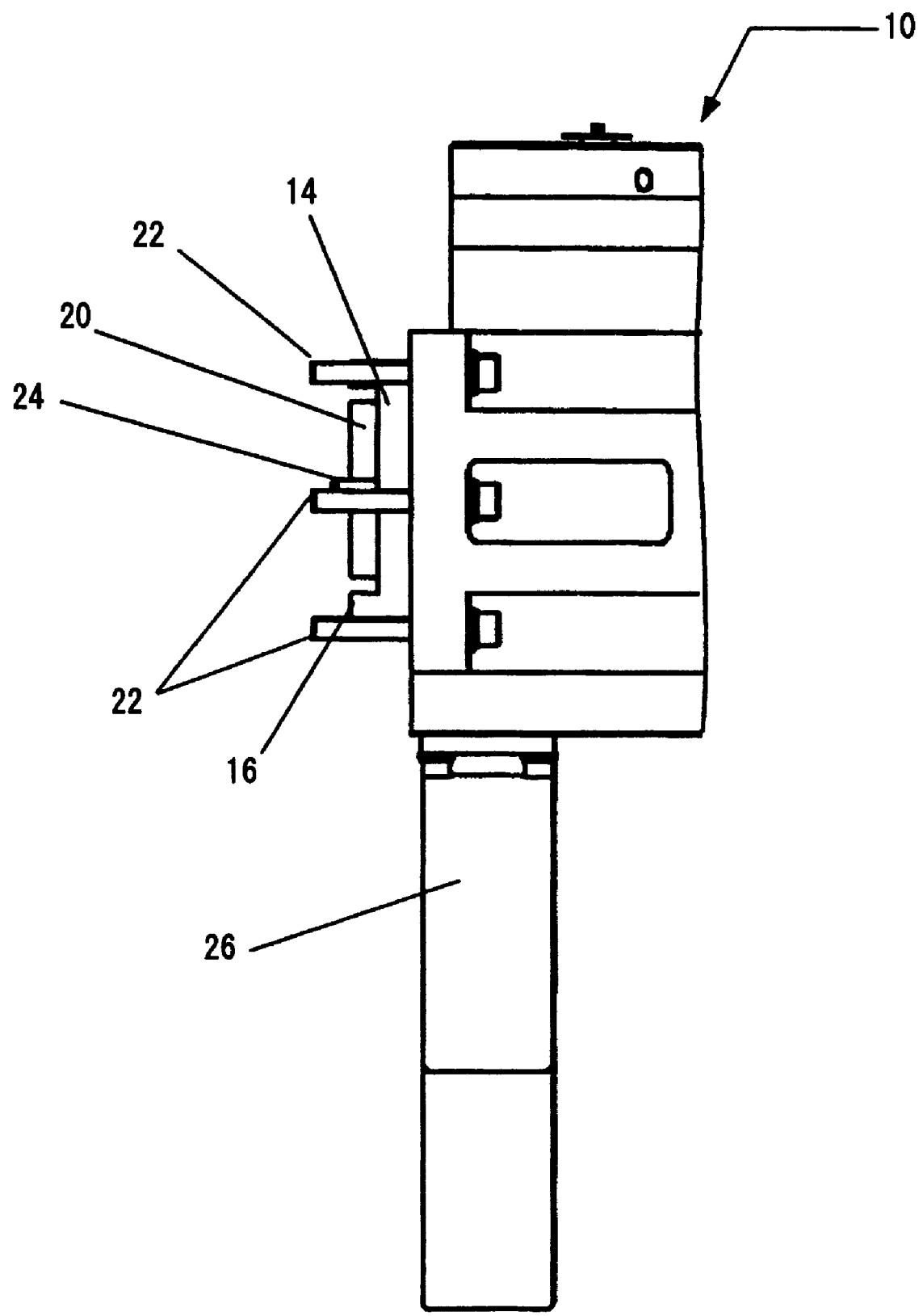
FIG. 2 is a side view of the first processing chamber shown in FIG. 1 in accordance with the principles of the present invention.
Figure 3:
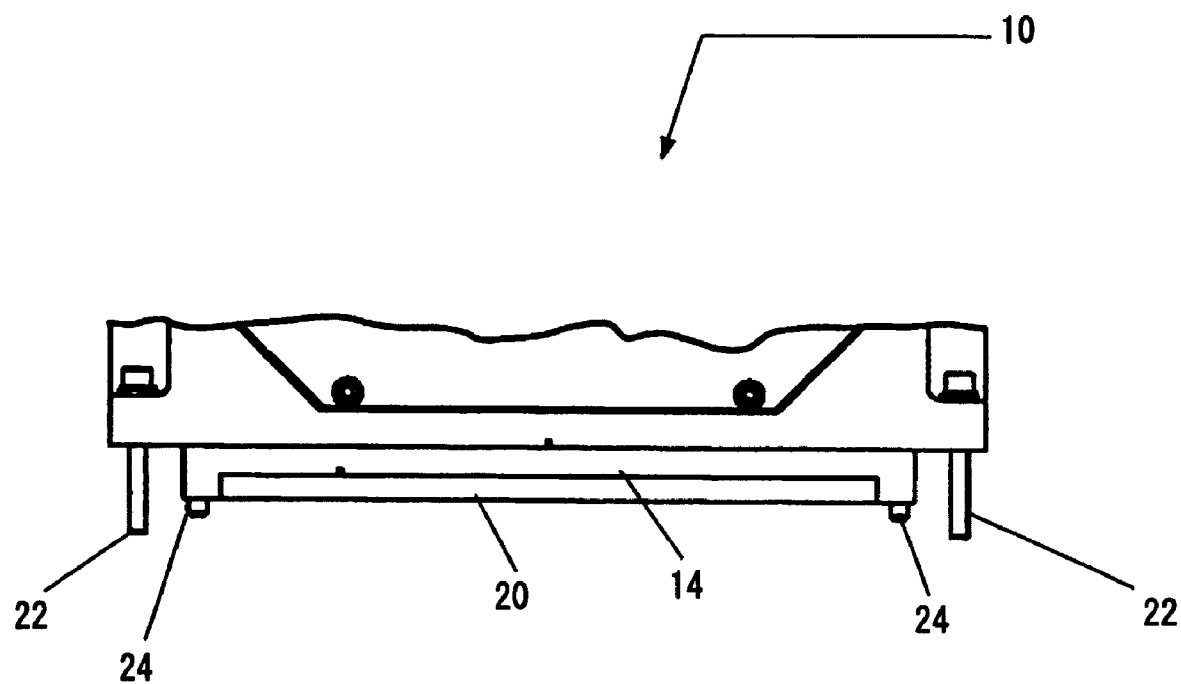
FIG. 3 is a top view of the first processing chamber shown in FIGS. 1 and 2 in accordance with the principles of the present invention.
Figure 4:
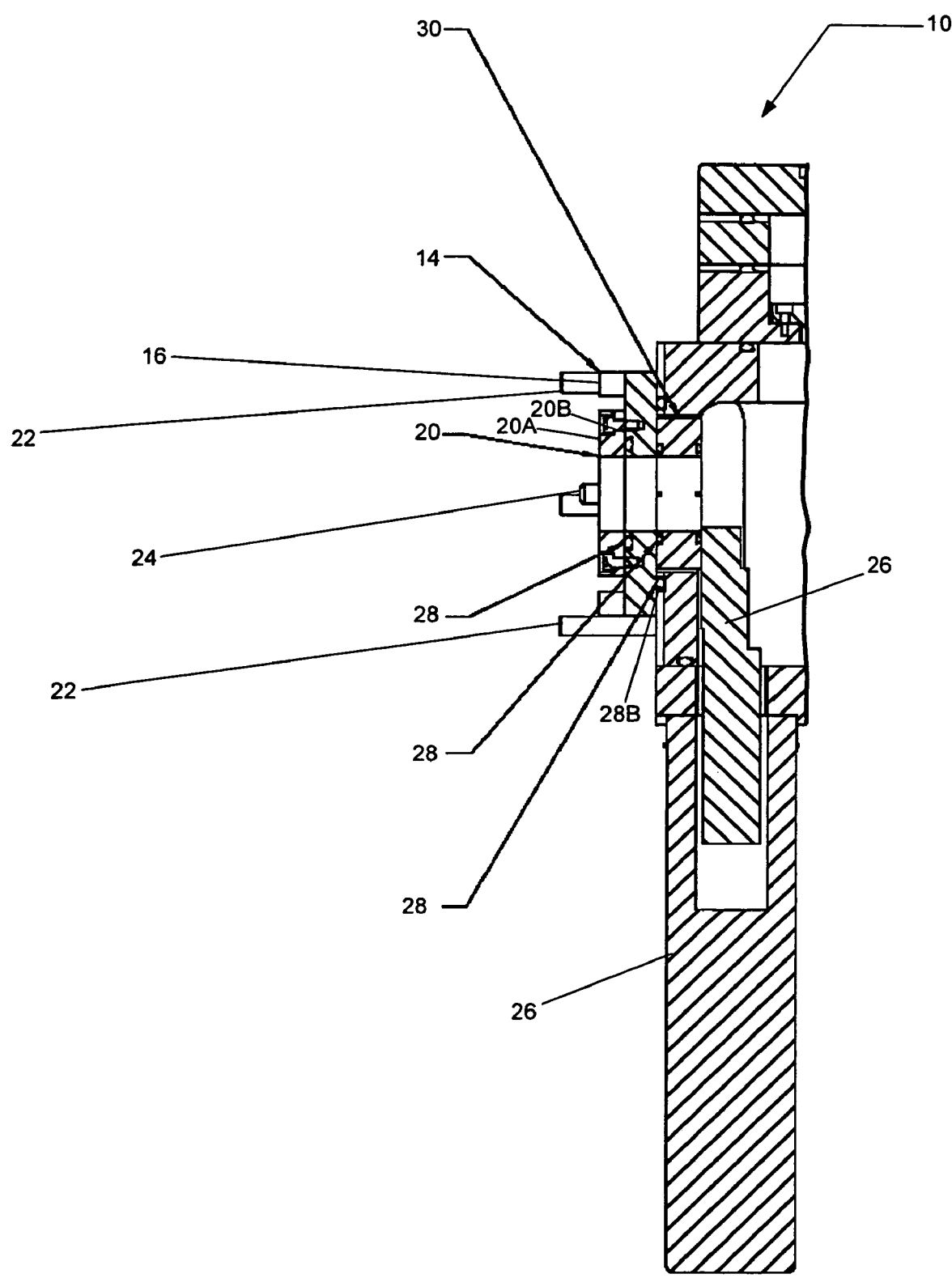
FIG. 4 is a cross-sectional side view of the first processing chamber shown in FIGS. 1, 2, and 3 in accordance with the principles of the present invention.

FIG. 1 is a perspective view of a first processing chamber 10 which can be thermally insulated from a second processing chamber in accordance with an embodiment of the present invention. FIG. 2 is a side view of the first processing chamber 10 shown in FIG. 1 in accordance with the principles of the present invention and FIG. 3 is a top view of the first processing chamber 10 shown in FIGS. 1 and 2 in accordance with the principles of the present invention. FIG. 4 is a cross-sectional side view of the first processing chamber shown in FIGS. 1, 2, and 3 in accordance with the principles of the present invention. As shown, processing chamber 10 includes a substrate transfer opening 12 for transferring a substrate from the first chamber 10 to a second chamber. Additionally, an interface plate 14 may be provided and may include at least one contact member 16 for making contact with the second chamber. The contact member maintains firm structural contact between the first chamber 10 and the second chamber and may have a much smaller surface area than the insulator plate such that the contact between the first chamber and the second chamber is minimized. A mating device 18 which includes an insulator plate 20 is provided around the transfer opening 12. The insulating plate 20 has a sufficiently low conductivity so as to minimize the thermal contact between the first chamber 10 and the second chamber. In embodiments, the insulating plate 20 may be constructed of Teflon™. Other materials can include polyimide, ceramic materials, and thermally insulating materials such as alumina, quartz, etc.

Chamber fastening devices 22 may be provided to securely fasten the first chamber 10 to the second chamber. As shown in FIG. 3, fastening devices 22 are fastened to the first chamber 10 from a flange formed within the chamber. Although the chamber fastening devices are shown as pins or screws, it should be understood that other fastening devices may also be used. For example, the chambers can be bound together from the outside using, for example, claw clamps or other clamping devices. In addition to the fastening devices 22, alignment devices 24 may be provided so the first chamber 10 can be more easily aligned with the second chamber. In FIG. 1, the alignment devices 24 are pins which will quickly align with holes in the second chamber to ensure that the two chambers are aligned properly. Although shown as pins, one of ordinary skill in the art would easily understand that other methods for alignment may be used as well. For example, a key-like structure could be constructed to allow the second chamber to sit within the first chamber 10.

As shown in FIG. 4, a plurality of seals 28 provide essentially air-tight seals between the various components. The air-tight seals can facilitate different pressures (vacuum, atmospheric, above atmospheric pressure) in each chamber. The air-tight seals can, for example, comprise an elastomer material (e.g., fluorosilicone, nitrile, fluorocarbon, silicone, neoprene, ethylene propylene, etc.). These materials are generally selected per application based upon the following physical characteristics: resistance to fluid, hardness, toughness, tensile strength, elongation, o-ring compression force, modulus, tear resistance, abrasion resistance, volume change, compression set, thermal effects, resilience, deterioration, corrosion, permeability, coefficient of friction, coefficient of thermal expansion, outgas rates, etc. Additionally, gate adapter plate 30 may also be provided around the transfer opening 12. The gate valve assembly 26 moves vertically to seal the transfer opening 12 during processing, cleaning, or whenever the first and second chambers may need to be isolated from each other.

In embodiments, the first chamber 10 may be a chemical oxide removal treatment chamber and accordingly, may include a gate valve assembly 26, as shown in FIG. 1. Additionally, the inside of the chambers may be essentially evacuated as would be the case for the first chamber 10 if it were a chemical oxide removal treatment chamber. Further, in the described embodiment of FIGS. 1–6, the insulating plate 20 would help maintain an essentially air-tight seal between the chambers. During processing, the environments within chambers 10 and 50 are generally maintained at reduced pressure. Therefore, in order to maintain a reduced pressure atmosphere (vacuum) relative to the external environment (i.e. atmospheric pressure outside of the chambers), the design and assembly of the chambers, and their interconnection should be such that vacuum integrity is maintained. In the described embodiment, the insulating plate 20 serves to thermally insulate the two chambers at their interconnection, and provide sealing surfaces at their interconnection.

Figure 5:
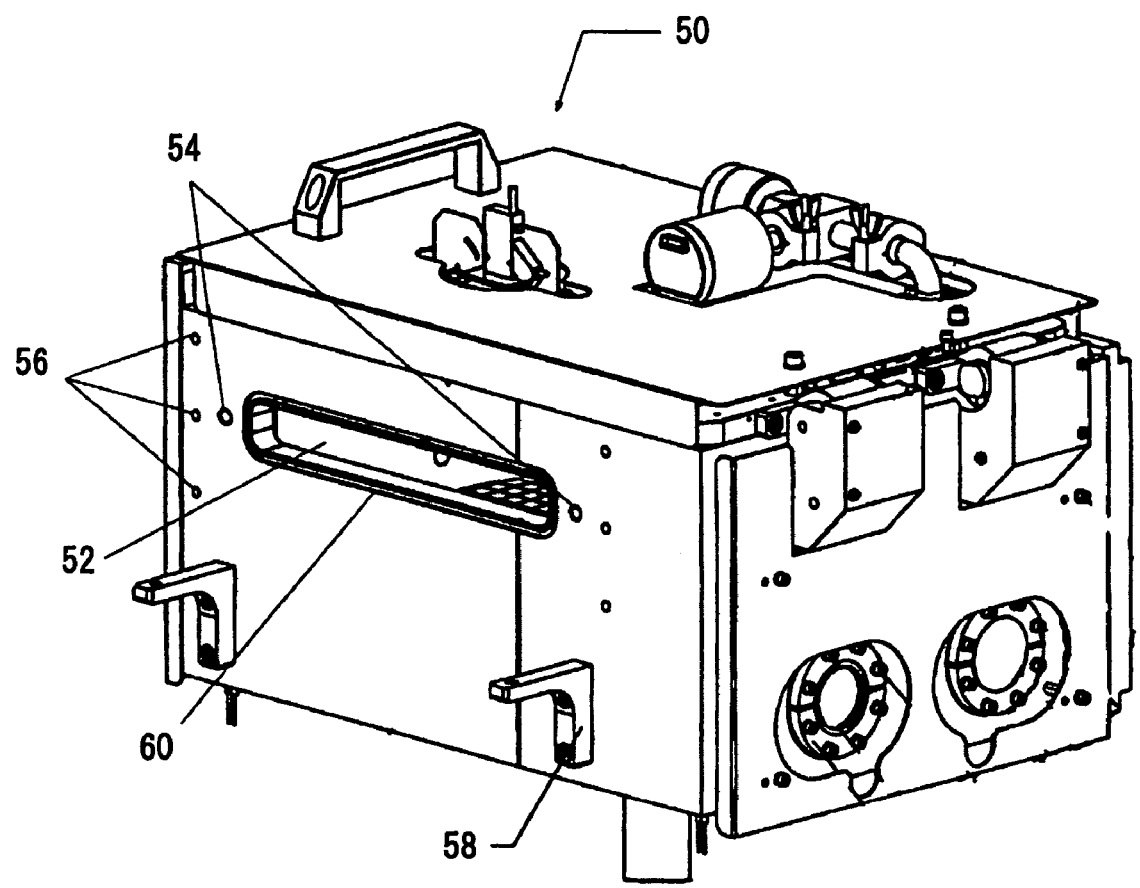
FIG. 5 is a perspective view of the second processing chamber which can be thermally insulated from the first processing chamber in accordance with an embodiment of the present invention.
Figure 6:
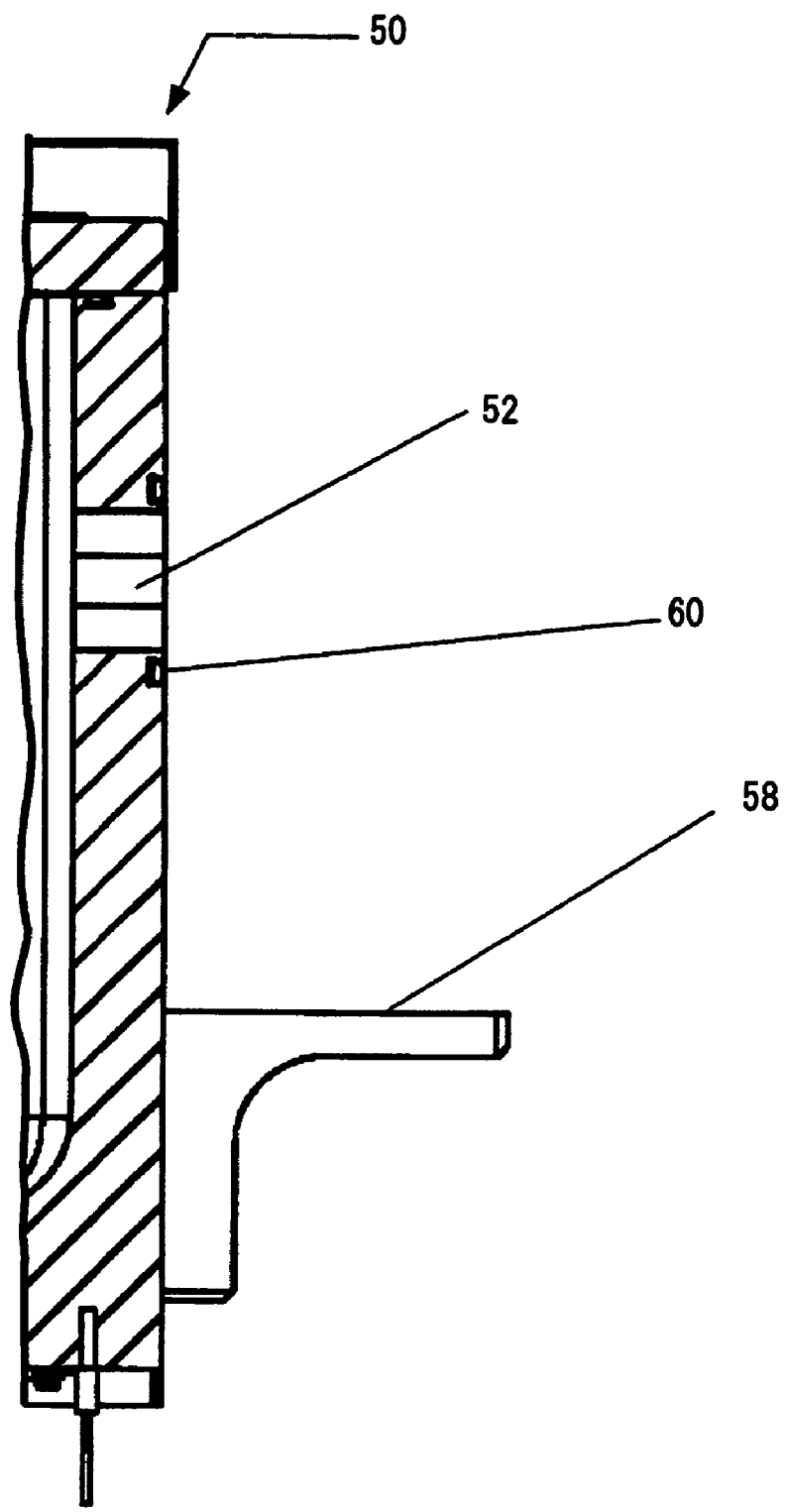
FIG. 6 is a cross-sectional side view of the second processing chamber shown in FIG. 5 in accordance with the principles of the present invention.
Figure 7:
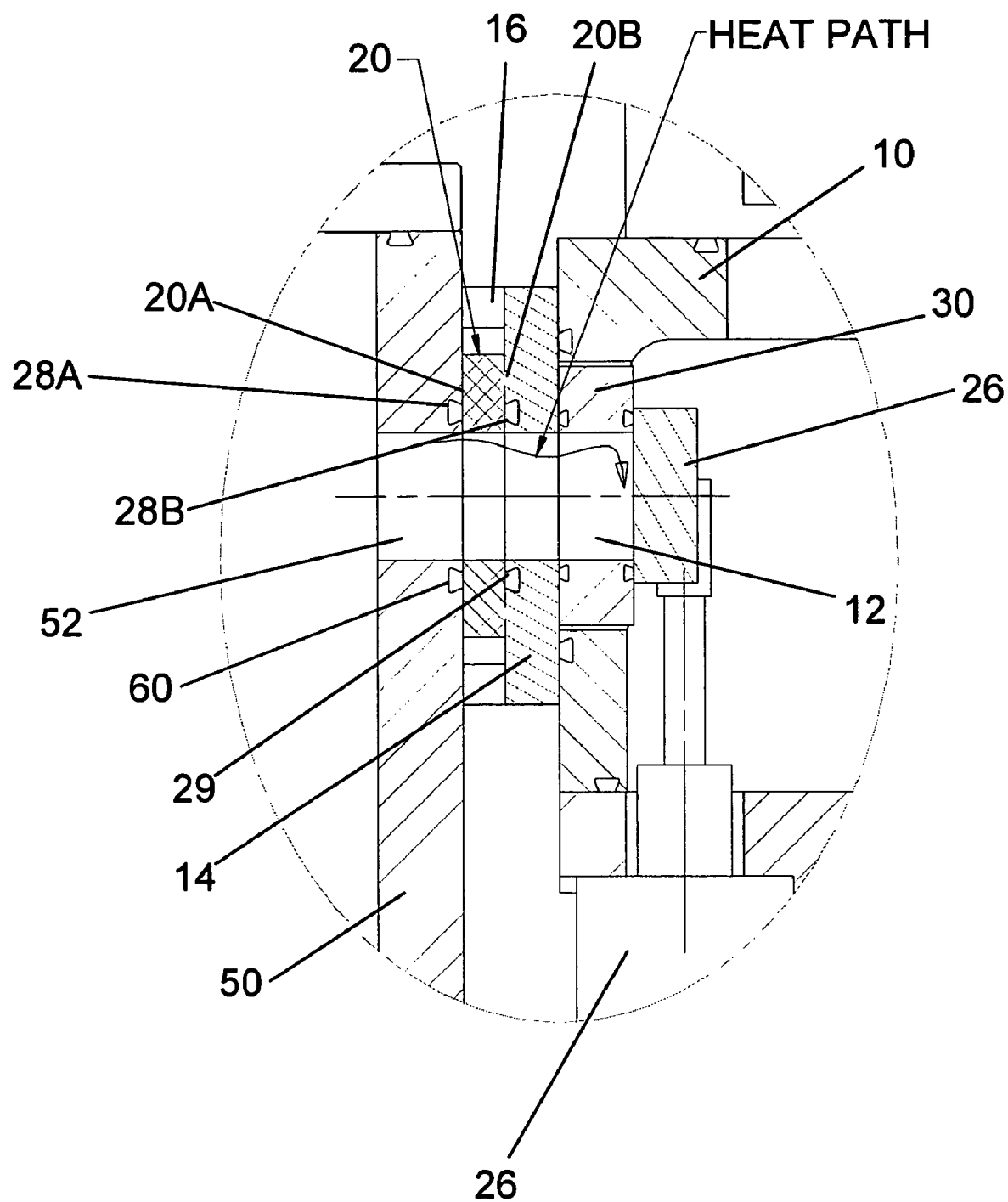
FIG. 7 is a cross-sectional side view of the first and second processing chambers in accordance with the principles of the present invention.

FIG. 5 is a perspective view of the second processing chamber 50 which can be thermally insulated from the first processing chamber 10 in accordance with an embodiment of the present invention. FIG. 6 is a cross-sectional side view of the second processing chamber 50 shown in FIG. 5 in accordance with the principles of the present invention. The second chamber 50 includes alignment holes 54 which correspond to the alignment device 24 shown on the first chamber 10. Accordingly, the alignment device 24 fits within the alignment holes 54. Additionally, fastening holes 56 are provided and configured to accept the fastening device 22 shown on the first chamber 10. FIG. 7 illustrates the coupling between the first chamber 10 and the second chamber 50. Around substrate transfer opening 52 is a seal groove 60 which is configured to accept a seal 28A, and, when pressed against a first surface 20A of the insulator plate 20, provides a vacuum seal between the second chamber 50 and the first surface 20A of the insulating plate 20. Additionally, around the transfer opening 12 is a seal groove 29 which is configured to accept another seal 28B, and, when pressed against a second surface 20B of the insulating plate 20, provides a vacuum seal between the interface plate 14 coupled to the first chamber 10 and the insulating plate 20. The design is such that vacuum integrity and structural integrity are maintained, and the two chambers 10 and 50 are thermally insulated from one another, as described above. Additionally, an attachment flange 58 may be provided to more securely fasten the first chamber 10 to the second chamber 50 (see FIG. 5).

Figure 8:
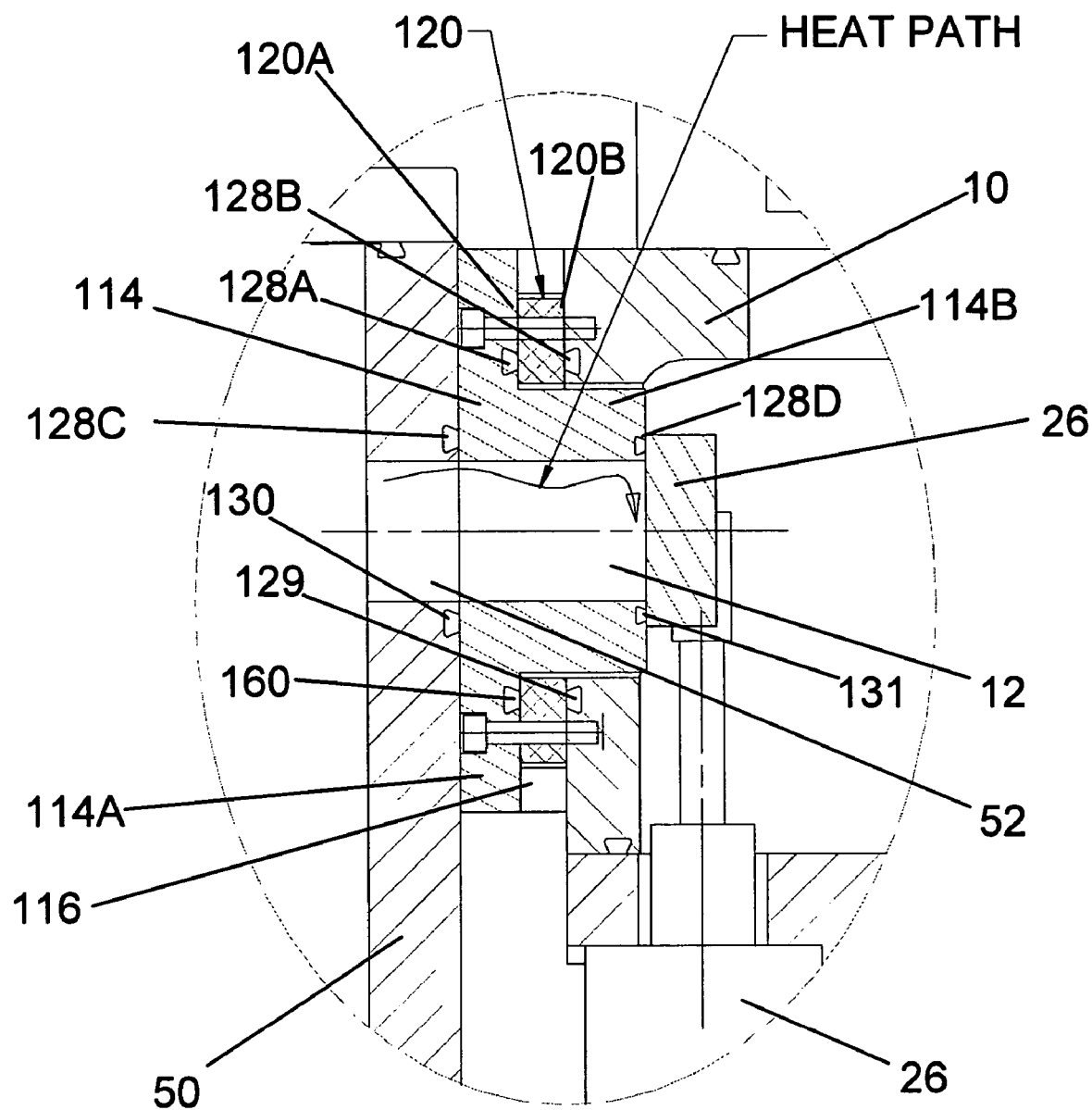
FIG. 8 is another cross-sectional side view of the first and second processing chambers in accordance with the principles of the present invention.

In an alternate embodiment, FIG. 8 illustrates another coupling between the first chamber 10 and the second chamber 50, wherein the design is such that vacuum integrity and structural integrity are maintained, and the two chambers 10 and 50 are thermally insulated from one another. The coupling comprises an interface plate 114 having a flange portion 114A, a frontal portion 114B, and an insulating plate 120. The frontal portion 114B extends through the insulating plate 120 to mate with the gate valve 26. Around the flange portion 114A of the interface plate 114 is a seal groove 160 which is configured to accept a seal 128A and which provides a vacuum seal between the interface plate 114 and the insulating plate 120 when pressed against a first surface 120A of the insulator plate 120. Around the substrate opening 12 is a seal groove 129 which is configured to accept a seal 128B and which provides a vacuum seal between the insulating plate 120 and the first chamber 10 when pressed against a second surface 120B of the insulator plate 120. Additionally, around the substrate transfer opening 52 is another seal groove 130 which is configured to accept a seal 128C and which provides a vacuum seal between the second chamber 50 and the interface plate 114 when pressed against the second chamber 52. Additionally, around the substrate transfer opening 12 is a seal groove 131 configured to accept a seal 128D which provides a vacuum seal between the interface plate 114 and the gate valve 26 when pressed against the interface plate 114. Interface plate 114 further comprises at least one contact member 116 for making contact between the first chamber 10 and the second chamber 50. The contact member maintains firm structural contact between the first chamber 10 and the second chamber 50 and may have a much smaller surface area than the insulator plate 120 such that the contact between the first chamber 10 and the second chamber 50 is minimized. In the embodiment described in FIG. 8, a continuous heat path is formed between the second chamber 50, the interface plate 114, and the gate valve 26. However, the second chamber 50 is thermally insulated from the first chamber 10 via the insulating plate 120. Conversely, in the embodiment described in FIG. 7, a broken heat path is formed between the second chamber 50, and the interface plate 114 and the gate valve 26. However, the second chamber 50 is still thermally insulated from the first chamber 10 via the insulating plate 120.

In embodiments, the second chamber 50 may be a heat treatment chamber.

The foregoing presentation of the described embodiments is provided to enable any person skilled in the art to utilize the present invention. Various modifications to these embodiments are possible and the generic principle of thermally insulating adjacent temperature controlled processing chambers presented herein may be applied to other embodiments as well. For example, the structures described by way of FIGS. 1–4 may be located on the second chamber 50 and the devices described with regard to FIGS. 5 and 6 may be located on the first chamber 10. In fact, any combination of locations would be acceptable. For example the fastening devices 22 may be on the first chamber while the alignment devices 24 are located on the second chamber. The insulating plate and mating device can also be located on either of the chambers, as can the gate valve assembly. Thus, the present invention is not intended to be limited to the embodiments shown above, but rather to be accorded the widest scope consistent with the principles and novelty of the features disclosed in any fashion herein.

What is claimed is:

1. A dual chamber apparatus comprising:
   a first chamber;
   a second chamber which is configured to be coupled to said first chamber at an interface, each of said first chamber and said second chamber having a transfer opening located at said interface;
   a gate valve assembly, disposed in said fast chamber, sealing said first chamber from said second chamber;
   an interface plate located on said second chamber, said interface plate comprising a flange portion abutting said second chamber and a frontal portion extending outwardly from said flange portion, wherein said frontal portion is constructed to engage said gate valve assembly in said first chamber; and
   an insulating plate located on one of said first chamber and said second chamber at said interface and configured to have a low thermal conductivity;
   wherein said first chamber and said second chamber can be independently controlled at different temperatures when said first chamber and said second chamber are coupled together,
   wherein, when said first and second chambers are coupled to one another, said insulating plate surrounds said frontal portion and is disposed adjacent to said flange portion,
   wherein said interface plate establishes a continuous heat path from said second chamber to said gate valve assembly, and
   wherein said interface plate comprises a contact member configured to separate said fast chamber from said second chamber by a predetermined distance, the contact member extending from the flange portion, along side the frontal portion, at a position farther from the frontal portion than the insulating plate.

2. The dual chamber apparatus as claimed in claim 1, further comprising:
   at least one alignment device on one of said first chamber and said second chamber; and
   at least one alignment hole corresponding to each said at least one alignment device on the other of said first chamber and said second chamber.

3. The dual chamber apparatus as claimed in claim 1, further comprising:
   at least one chamber fastening device on one of said first chamber and said second chamber; and
   at least one chamber fastening hole corresponding to each said at least one alignment device on the other of said first chamber and said second chamber.

4. The dual chamber apparatus as claimed in claim 1, wherein said first chamber is a chemical oxide removal chamber and said second chamber is a heat treatment chamber.

5. The dual chamber apparatus as claimed in claim 1, wherein said insulating plate is located on said second chamber.

6. The dual chamber apparatus us claimed in claim 1, wherein said first chamber and said second chamber are essentially evacuated and a seal created between said first chamber and said second chamber is a vacuum seal.

7. The dual chamber apparatus as claimed in claim 1, wherein said insulating plate is located on said first chamber.

8. The dual chamber apparatus as claimed in claim 1, wherein said insulating plate is constructed of polytetrafluoroethylene.

9. The dual chamber apparatus as claimed in claim 1, wherein a surface area of said contact member is substantially smaller than a surface area of said insulating plate.

10. A method for manufacturing a dual chamber system comprising a first chamber and a second chamber, the method comprising:
    coupling an insulating plate around a transfer opening of one of said first chamber and said second chamber;
    coupling an interface plate on said second chamber, said interface plate comprising a flange portion abutting said second chamber and a frontal portion extending outwardly from said flange portion, wherein said frontal portion is constructed to engage a gate valve assembly in said first chamber, wherein, when said first and second chambers are coupled to one another, said insulating plate surrounds said frontal portion and is disposed adjacent to said flange portion, wherein said interface plate establishes a continuous heat path from said second chamber to said gate valve assembly, and wherein said interface plate comprises a contact member configured to separate said first chamber from said second chamber by a predetermined distance, the contact member extending from the flange portion, along side the frontal portion, at a position farther from the frontal portion than the insulating plate;
    aligning said first chamber with said second chamber at an interface;
    coupling said first chamber to said second chamber;
    forming a vacuum seal between said first chamber and said second chamber; and
    controlling a temperature within said first chamber and said second chamber independently when said first chamber and said second chamber are coupled together.

11. The method for manufacturing a dual chamber system as claimed in claim 10, further comprising separating said first chamber and from said second chamber by a predetermined distance.

12. A dual chamber apparatus comprising:
    a first chamber;
    a second chamber which is configured to be coupled to said first chamber at an interface, each of said first chamber and said second chamber having a transfer opening located at said interface;
    an insulating plate located between said first chamber and said second chamber at said interface;
    a contact member configured to separate said first chamber from said second chamber by a predetermined distance, the surface area of said contact member being substantially smaller than a surface area of said insulating plate;

at least one alignment structure on one of said first chamber and said second chamber;

at least one complementary alignment structure corresponding to each said at least one alignment structure on the other of said first chamber and said second chamber a gate valve assembly, disposed in said first chamber, sealing said first chamber from said second chamber; and an interface plate located on said second chamber, said interface plate comprising a flange portion abutting said second chamber and a frontal portion extending outwardly from said flange portion, wherein said frontal portion is constructed to engage said gate valve assembly in said first chamber;

wherein, when said first and second chambers are coupled to one another, said insulating plate surrounds said frontal portion and is disposed adjacent to said flange portion, wherein said interface plate establishes a continuous heat path from said second chamber to said gate valve assembly, and wherein the contact member extends from the flange portion of the interface plate, along side the frontal portion, at a position farther from the frontal portion than the insulating plate.

* * * * *